United States Patent
Takahashi (10) Patent No.: US 6,764,609 B2
(45) Date of Patent: Jul. 20, 2004

(54) PIEZOELECTRIC CERAMIC COMPOSITION AND PIEZOELECTRIC ELEMENT USING THE SAME

(75) Inventor: Keiichi Takahashi, Nishinomiya (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/268,269

(22) Filed: Oct. 9, 2002

(65) Prior Publication Data

US 2003/0100436 A1 May 29, 2003

(30) Foreign Application Priority Data

Oct. 11, 2001 (JP) ........................................ 2001-314248

(51) Int. Cl.[7] ...................... C04B 35/495; H01L 41/187
(52) U.S. Cl. .............................. 252/62.9 R; 501/135; 501/136; 310/369; 310/368
(58) Field of Search ................... 252/62.9 R; 501/135, 501/136; 310/369, 368

(56) References Cited

U.S. PATENT DOCUMENTS

| | | | |
|---|---|---|---|
| 5,279,996 A | 1/1994 | Hase et al. | |
| 6,117,354 A | 9/2000 | Kimura et al. | |
| 6,258,291 B1 | 7/2001 | Kimura et al. | |
| 6,383,411 B1 | 5/2002 | Sawada et al. | |
| 6,423,244 B1 * | 7/2002 | Sawada et al. | 252/62.9 R |
| 6,488,864 B2 * | 12/2002 | Kimura et al. | 252/62.9 R |

FOREIGN PATENT DOCUMENTS

| | | |
|---|---|---|
| EP | 0 982 782 | 3/2000 |
| JP | 5-139824 | 6/1993 |
| JP | 5-148016 | 6/1993 |
| JP | 7-82024 | 3/1995 |
| JP | 11-322426 | 11/1999 |
| JP | 2000-264733 | 9/2000 |
| JP | 2000-313662 | 11/2000 |
| JP | 2001-72466 | 3/2001 |
| JP | 2001-130960 | 5/2001 |
| JP | 2001-130961 | 5/2001 |
| JP | 2001-151573 | 6/2001 |
| JP | 2001-172082 | 6/2001 |
| JP | 2001-240471 | 9/2001 |
| JP | 2001-294486 | 10/2001 |
| JP | 2001-328866 | 11/2001 |
| JP | 2002-145669 | * 5/2002 |

OTHER PUBLICATIONS

Translation for JP 2001-294486.*
http://WWW.CNIECJX.COM.CN/products1.htm, "Tantalum Niobium Concentrate".
http://www.beyondchem.com/nb-oxide.htm, "NIOBIUM PENT-OXIDE".
"Energy Trapping Characteristics of Bismuth Layer Structured Compound Ca $Bi_4$ $Ti_4$ $O_{15}$"; Kimura, M.; Sawada, T.; Ando, A.; Sakabe, Y.; Japanese Journal Of Applied Physics; vol. 38; 1999; pp. 5557–5560.

* cited by examiner

*Primary Examiner*—C. Melissa Koslow
(74) *Attorney, Agent, or Firm*—Merchant & Gould, P.C.

(57) ABSTRACT

A piezoelectric ceramic composition is provided, which includes a ceramic composition expressed by a general formula: $Sr_{1-x-y}M1_xM2_yBi_2(Nb_{1-a}Ta_a)_{2-z}Ti_zO_9$, wherein M1 is at least one element selected from the group consisting of Ca and Ba, M2 is at least one element selected from the group consisting of La, Y, Dy, Er, Yb, Pr, Nd, Sm, Eu and Gd, and x, y, z and a in the general formula respectively are in the range of $0.0 \leq x < 0.9$, $0.0 < y < 0.3$, $0.0 \leq z < 0.3$, and $0.0 \leq a \leq 1.0$. This makes it possible to provide a piezoelectric ceramic composition that is free of lead and has a larger electromechanical coupling factor than a conventional bismuth layered compound, and a piezoelectric element using the same.

12 Claims, 4 Drawing Sheets

PIEZOELECTRIC CERAMIC COMPOSITION AND PIEZOELECTRIC ELEMENT USING THE SAME

BACKGROUND OF THE INVENTION

1. Field of the Invention

The present invention relates to a piezoelectric ceramic composition that is free of lead (Pb) and mainly contains Sr, Bi, Ti and Nb or Ta, and a piezoelectric element using the same.

2. Description of Related Art

Conventionally, as piezoelectric ceramic compositions used for piezoelectric ceramic elements such as a piezoelectric ceramic oscillator and a piezoelectric ceramic filter, ceramic compositions containing lead zirconate titanate (PZT: $Pb(Ti_xZr_{1-x})O_3$) or lead titanate (PT: $PbTiO_3$) as a principal component have been used. (For example, see JP 5(1993)-148016 A and JP 5(1993)-139824 A.)

However, the piezoelectric ceramic compositions containing PZT or PT as a principal component contain a great amount of lead, leading to a problem that uniformity of a product declines because of the evaporation of a lead oxide during a manufacturing process. Further, many of the piezoelectric ceramic compositions containing PZT or PT have a Curie point of about 200° C. to 300° C. in practice. Since they become paraelectric at a temperature higher than the Curie point and lose piezoelectric properties, they are difficult to use in applications under a high temperature. Moreover, in recent years, there has been an increasing demand for the development of lead-free ceramic compositions in order to prevent damage to the environment.

Under such circumstances, as ceramics for a sensor/actuator that is free of lead and applicable even at a high temperature, piezoelectric ceramic compositions containing a bismuth layered compound such as $SrBi_2Nb_2O_9$ as a principal component have become a focus of attention. (For example, see JP 11(1999)-322426 A.)

However, although it is generally desirable that a material used for a piezoelectric ceramic element, especially, a piezoelectric ceramic oscillator, have a large electromechanical coupling factor, which is an efficiency of converting an electric energy into a mechanical energy, there is a problem that the conventionally reported piezoelectric ceramic compositions containing a bismuth layered compound as a principal component do not have a sufficiently large electromechanical coupling factor. Also, when piezoelectric ceramic filters, piezoelectric ceramic oscillators or the like are produced using the piezoelectric ceramic compositions containing a bismuth layered compound as a principal component, there is a problem that the rate of change in a resonance frequency according to temperature becomes larger compared with the conventional case of using the PZT or PT.

Owing to these problems, the piezoelectric ceramic compositions containing the bismuth layered compound such as $SrBi_2Nb_2O_9$ as a principal component have not yet been in practical use.

SUMMARY OF THE INVENTION

A piezoelectric ceramic composition according to the present invention includes a ceramic composition expressed by a general formula: $Sr_{1-x-y}M1_xM2_yBi_2(Nb_{1-a}Ta_a)_{2-z}Ti_zO_9$, wherein M1 is at least one element selected from the group consisting of Ca and Ba, M2 is at least one element selected from the group consisting of La, Y, Dy, Er, Yb, Pr, Nd, Sm, Eu and Gd, and x, y, z and a in the general formula respectively are in the range of $0.0 \leq x < 0.9$, $0.0 < y < 0.3$, $0.0 \leq z < 0.3$, and $0.0 \leq a \leq 1.0$.

Further, a piezoelectric element according to the present invention includes a piezoelectric body formed of a piezoelectric ceramic composition including a ceramic composition expressed by a general formula: $Sr_{1-x-y}M1_xM2_yBi_2(Nb_{1-a}Ta_a)_{2-z}Ti_zO_9$, wherein M1 is at least one element selected from the group consisting of Ca and Ba, M2 is at least one element selected from the group consisting of La, Y, Dy, Er, Yb, Pr, Nd, Sm, Eu and Gd, and x, y, z and a in the general formula respectively are in the range of $0.0 \leq x < 0.9$, $0.0 < y < 0.3$, $0.0 \leq z < 0.3$, and $0.0 \leq a \leq 1.0$.

DESCRIPTION OF THE PREFERRED EMBODIMENTS

The following is a description of embodiments of the present invention.

A piezoelectric ceramic composition of the present embodiment is expressed by a general formula: $Sr_{1-x-y}M1_xM2_yBi_2(Nb_{1-a}Ta_a)_{2-z}Ti_zO_9$. Also, x, y, z and a in the general formula respectively are in the range of $0.0 \leq x < 0.9$, $0.0 < y < 0.3$, $0.0 \leq z < 0.3$, and $0.0 \leq a \leq 1.0$. Herein, in the general formula, M1 is at least one element selected from the group consisting of Ca and Ba, and M2 is at least one element selected from the group consisting of La, Y, Dy, Er, Yb, Pr, Nd, Sm, Eu and Gd. Furthermore, the piezoelectric ceramic composition of the present embodiment may be formed solely of a compound expressed by the above general formula, or may contain the compound expressed by the above general formula as a principal component and other substances as a subsidiary component. In the case where the piezoelectric ceramic composition is formed of a principal component and a subsidiary component, the constituent ratio of the principal component to the subsidiary component preferably is in the range between 96.0:4.0 and 99.9:0.1 inclusive (weight ratio), and more preferably is between 99.2:0.8 and 99.8:0.2 inclusive (weight ratio).

This makes it possible to obtain a piezoelectric ceramic composition that has a larger electromechanical coupling factor than a conventional bismuth layered compound and is free of lead. When a conventional bismuth niobate compound is made to contain Ti so as to achieve a composition expressed by the general formula according to the present embodiment, its relative dielectric constant improves, accompanied by an increase in the piezoelectric constant.

Also, in the piezoelectric ceramic composition of the present embodiment, it is preferable that x, y, z and a in the general formula respectively are in the range of $0.2 \leq x \leq 0.8$, $0.0 < y < 0.15$, $0.0 < z < 0.15$, and $0.0 \leq a \leq 0.6$. By satisfying these ranges, it is possible to obtain a piezoelectric ceramic composition that has a larger electromechanical coupling factor than a conventional bismuth layered compound and is free of lead and to improve the piezoelectric properties further.

Furthermore, the piezoelectric ceramic composition of the present embodiment preferably contains not greater than 0.8 wt % $MnO_2$, more preferably 0.2 wt % to 0.5 wt % $MnO_2$, as the subsidiary component. This makes it easier to conduct a polarization treatment.

Moreover, a piezoelectric element of the present embodiment includes a piezoelectric body formed of any of the piezoelectric ceramic compositions described above. This makes it possible to obtain a piezoelectric element that is free of lead and has excellent electric characteristics.

It is preferable that the piezoelectric element of the present embodiment satisfies $22 \leq S/t^2$, wherein S is an area of an electrode formed on a surface of the piezoelectric body, and t is a thickness of the piezoelectric body. Moreover, it is preferable that the piezoelectric element of the present embodiment satisfies $5.3 \leq D/t$, wherein D is an effective diameter of an electrode when the piezoelectric body is approximated effectively to a circular shape, and t is a thickness of the piezoelectric body. In either case, the size of the electrodes on the two principal planes is made larger with respect to the thickness t. Therefore, an influence of the decentered electrodes is reduced, allowing an easier manufacturing of a piezoelectric element.

Next, embodiments of the present invention will be described, with reference to accompanying drawings.

First Embodiment

The present embodiment is directed to a piezoelectric ceramic composition.

The piezoelectric ceramic composition of the present embodiment (in the following, sometimes referred to as a piezoelectric ceramic composition 1) contains a ceramic component expressed by a general formula: $Sr_{1-x-y}M1_xM2_yBi_2(Nb_{1-a}Ta_a)_{2-z}Ti_zO_9$ as a principal component, wherein M1 is either Ca or Ba, and M2 is any of La, Y, Dy, Er, Yb, Pr, Nd, Sm, Eu and Gd. In the above general formula, a, x, y and z respectively are in the range of $0.0 \leq a \leq 1.0$, $0.0 \leq x < 0.9$, $0.0 \leq y < 0.3$ and $0.0 \leq z < 0.3$. In order to achieve an electromechanical coupling factor larger than that of the conventional bismuth layered compound, it is more preferable that a satisfies $0.0 \leq a \leq 0.6$, x satisfies $0.2 \leq x \leq 0.8$, y satisfies $0.0 < y < 0.15$ and z satisfies $0.0 < z < 0.15$.

The piezoelectric ceramic composition 1 can be formed by mixing materials to be the principal component at a predetermined ratio and burning the mixture at 1050° C. to 1200° C. for 1 to 2 hours. The burning atmosphere is the air.

The above-mentioned materials can be various compounds containing elements contained in the piezoelectric ceramic composition 1, for example, a metal oxide or a metal carboxylate. It is preferable to use a metal oxide because the change in weight before and after a provisional burning is particularly small. This metal oxide can be, for example, $La_2O_3$, $Y_2O_3$, $Dy_2O_3$, $Er_2O_3$, $Yb_2O_3$, $Pr_2O_3$, $Nd_2O_3$, $Sm_2O_3$, $Eu_2O_3$, $Gd_2O_3$, $Mn_3O_4$, $Bi_2O_3$, $TiO_2$, $Nb_2O_5$ and $Ta_2O_5$. As the metal carboxylate, $CaCO_3$, $SrCO_3$ or $BaCO_3$ can be used, for example.

The piezoelectric ceramic composition 1 may be formed of the principal component alone or further contain $MnO_2$ or the like as a subsidiary component. The piezoelectric ceramic composition containing a subsidiary component achieves excellent properties such as a mechanical quality factor $Q_M$. As the subsidiary component, $MnO_2$, $Cr_2O_3$, CoO, $Fe_2O_3$, NiO or the like can be used, and it is particularly preferable to use $MnO_2$ because of its ability to raise the mechanical quality factor $Q_M$. In the case where the piezoelectric ceramic composition 1 is formed of the principal component alone, this composition can be expressed by the formula below:

$$Sr_{1-x-y}Ca_xLa_yBi_2(Nb_{1-a}Ta_a)_{2-z}Ti_zO_9$$

when M1 is Ca and M2 is La, for example.

In the case where the piezoelectric ceramic composition is formed of a principal component and a subsidiary component, the constituent ratio of the principal component to the subsidiary component preferably is in the range between 96.0:4.0 and 99.9:0.1 inclusive (weight ratio), and more preferably is between 99.2:0.8 and 99.8:0.2 inclusive (weight ratio). When the subsidiary component is $MnO_2$, the piezoelectric ceramic composition 1 contains $MnO_2$ preferably in the range of not greater than 0.8 wt %, more preferably in the range of 0.2 wt % to 0.5 wt %.

In the case where the piezoelectric ceramic composition 1 contains the principal component and the subsidiary component, the piezoelectric ceramic composition 1 can be manufactured by mixing starting materials that are to be these components and burning the mixture. The burning condition can be the same as that for manufacturing the piezoelectric ceramic composition containing the principal component alone described above.

It is preferable that the piezoelectric ceramic composition 1 has as large a frequency constant $N_{3t}$ as possible regarding a third harmonic thickness extensional vibration. For example, it is preferable that $N_{3t}$ is at least 7300 Hz•m, because the propagation speed of vibration in a solid matter (the sonic speed) becomes larger, thus allowing a relatively large element thickness. For example, an element for 36 MHz can be made to have a thickness of 200 μm or larger. In this case, usually, a frequency constant $N_p$ of a radial expand mode also becomes as large as at least 2500 Hz•m.

As described above, according to the piezoelectric ceramic composition 1 of the first embodiment, it is possible to obtain a piezoelectric ceramic composition having a relatively large electromechanical coupling factor, compared with a lead-free bismuth layered compound produced on the basis of a conventional general method for producing ceramics.

Second Embodiment

The present embodiment is directed to a first piezoelectric element. A piezoelectric element of the present embodiment (in the following, sometimes referred to as a piezoelectric element 1) includes a piezoelectric body formed of the piezoelectric ceramic composition 1 described in the first embodiment.

More specifically, the piezoelectric element 1 is a piezoelectric resonator such as a piezoelectric ceramic oscillator or a piezoelectric ceramic filter, a piezoelectric vibrator such as a buzzer or a sounder, or a displacement element such as an actuator, for example.

Figure 1:
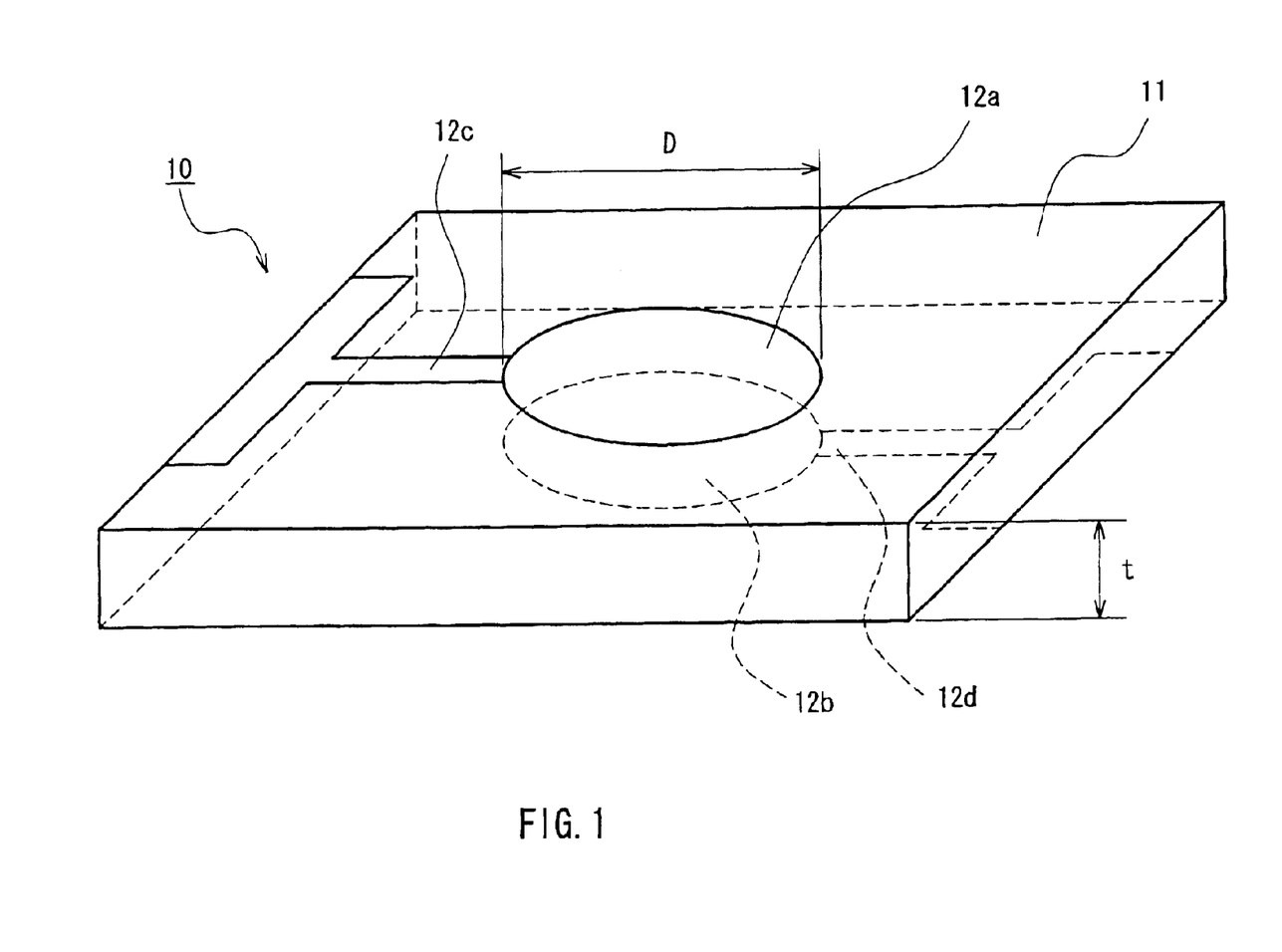
FIG. 1 is a perspective view showing an example of a third harmonics of thickness extensional (TE) mode resonator in a second embodiment of the present invention.

FIG. 1 is a perspective view showing a third harmonics of thickness extensional (TE) mode resonator as an example of the piezoelectric element according to the present embodiment. Referring to FIG. 1, a piezoelectric resonator 10 includes a piezoelectric body 11, and electrodes 12a and 12b that are formed on two principal planes of the piezoelectric body 11. The electrodes 12a and 12b can be made of Ag, Cu, Ni, Pt, Au or an Ag-Pd alloy. The electrodes 12a and 12b are connected with leads 12c and 12d, respectively. The leads 12c and 12d can be made of any of the materials for the electrodes 12a and 12b mentioned above.

The electrodes 12a and 12b have a circular shape. However, their shapes are not limited to a circle but may be other shapes such as a square or a rectangle. The electrodes 12a and 12b are formed to have an identical shape and to face each other with the piezoelectric body 11 being sandwiched therebetween.

It is preferable that the area S of the electrodes 12a and 12b and the thickness t of the piezoelectric body 11 satisfy a relationship of $22 \leq S/t^2$. In other words, it is preferable that the diameter D of the electrodes 12a and 12b and the thickness t of the piezoelectric body 11 satisfy a relationship of $5.3 \leq D/t$. By satisfying these relationships, it becomes possible to achieve a dimension ratio that can suppress easily the generation of unnecessary vibrations (spurious vibrations) caused by decentered electrodes.

As described above, since the piezoelectric element 1 according to the present embodiment uses the piezoelectric ceramic composition 1 of the first embodiment, it is free of lead and has excellent electric characteristics.

Third Embodiment

The present embodiment is directed to a second piezoelectric element. A piezoelectric element of the present embodiment (in the following, sometimes referred to as a piezoelectric element 2) includes a piezoelectric body formed of the piezoelectric ceramic composition 1 described in the first embodiment.

More specifically, the piezoelectric element 2 is a piezoelectric resonator such as a piezoelectric ceramic oscillator or a piezoelectric ceramic filter, a piezoelectric vibrator such as a buzzer or a sounder, or a displacement element such as an actuator, for example.

Figure 2:
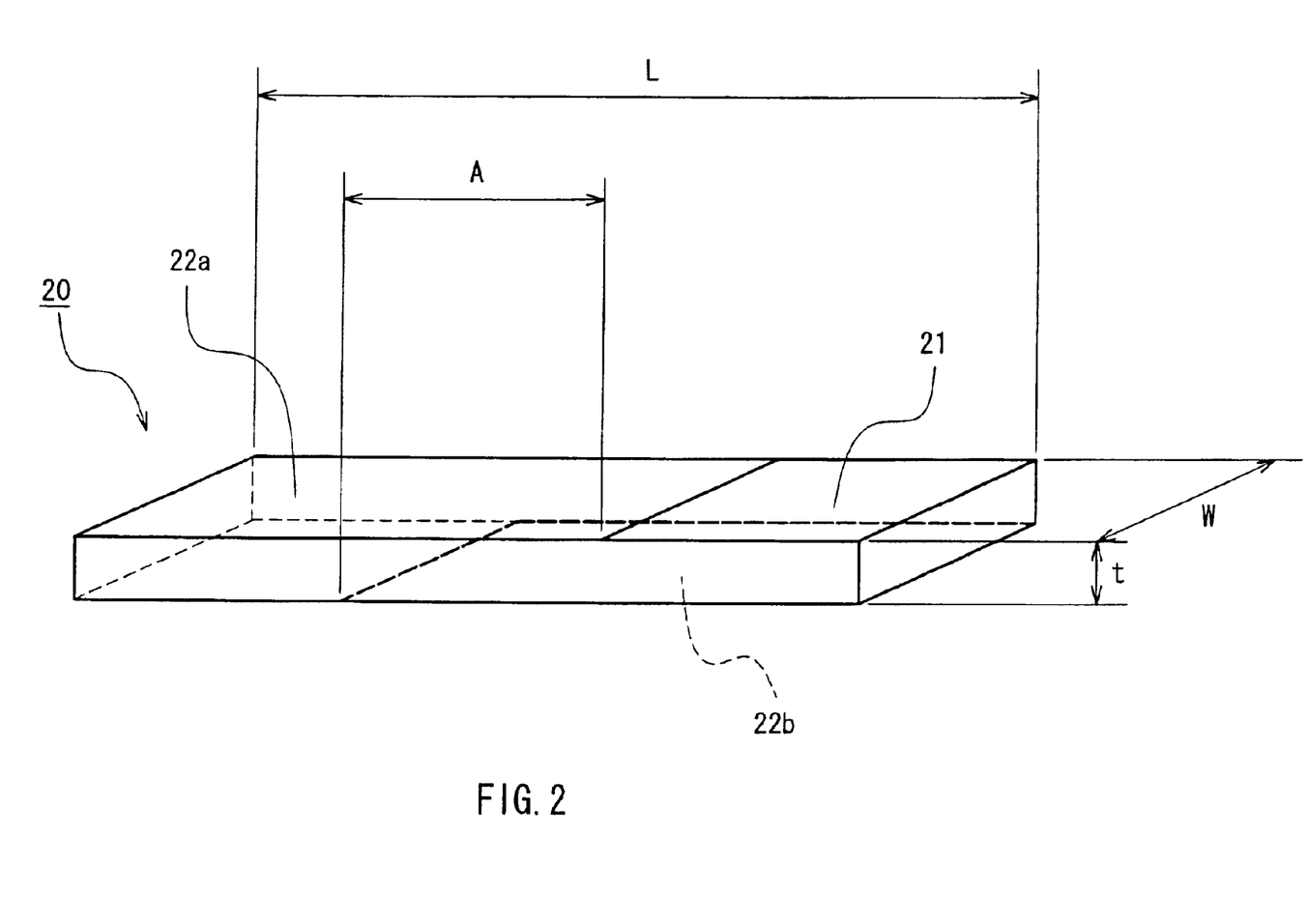
FIG. 2 is a perspective view showing an example of a thickness shear vibration (TS) mode resonator in a third embodiment of the present invention.

FIG. 2 is a perspective view showing a thickness shear vibration (TS) mode resonator as an example of the piezoelectric element according to the present embodiment. Referring to FIG. 2, a piezoelectric resonator 20 includes a piezoelectric body 21, and electrodes 22a and 22b that are formed on two principal planes of the piezoelectric body 21. The electrodes 22a and 22b can be made of any of the materials for the electrodes 12a and 12b in the second embodiment. The electrodes 22a and 22b have a strip shape, and they are formed to have an identical shape and to face each other with the piezoelectric body 21 being sandwiched therebetween.

As described above, since the piezoelectric element 2 according to the present embodiment uses the piezoelectric ceramic composition 1 of the first embodiment, it is free of lead and has excellent electric characteristics.

The following is a specific description of the present invention by way of examples.

EXAMPLE 1

In the present example, an example of producing the piezoelectric ceramic composition 1 of the first embodiment will be described.

In the present example, using $CaCO_3$, $SrCO_3$, $BaCO_3$, $La_2O_3$, $Y_2O_3$, $Dy_2O_3$, $Er_2O_3$, $Yb_2O_3$, $Pr_2O_3$, $Nd_2O_3$, $Sm_2O_3$, $Eu_2O_3$, $Gd_2O_3$, $Mn_3O_4$, $Bi_2O_3$, $TiO_2$, $Nb_2O_5$ and $Ta_2O_5$ as starting materials, a plurality of piezoelectric ceramic compositions were formed. Incidentally, $Mn_3O_4$ turns into $MnO_2$ by a heat treatment during burning.

More specifically, the starting materials were weighed so that the piezoelectric ceramic compositions to be formed would achieve predetermined composition ratios shown in Table 1 and Table 2, and then mixed sufficiently by a ball mill until the mixture becomes uniform. After a provisional burning of the mixture at 880° C. for 2 hours, the formed compounds were each pulverized again by the ball mill and supplied with polyvinyl alcohol for granulation. The resultant powder was formed into a 13 mm-diameter disc by a uniaxial press forming at 70 MPa and burned at 1100° C. to 1200° C. for 2 hours. This disc sample was abraded to have a thickness of 0.3 mm, and then Ag electrodes having a thickness of 0.8 μm were attached to upper and lower surfaces of the disc. Thereafter, a polarization treatment was conducted by applying an electric field of 10 kV/mm for 30 minutes in a silicone oil at 160° C., thus obtaining a disc formed of a piezoelectric ceramic.

The principal components of Samples 1 to 21 are expressed by a formula: $Sr_{1-x-y}Ca_xLa_yBi_2Nb_{2-z}Ti_zO_9$, those of Samples 22 to 26 are expressed by a formula: $Sr_{1-x-y}Ca_xLa_yBi_2(Nb_{1-a}Ta_a)_{2-z}Ti_zO_9$, and those of Samples 27 to 41 are expressed by a formula: $Sr_{1-x-y}M1_xM2_yBi_2(Nb_{1-a}Ta_a)_{2-z}Ti_zO_9$ (wherein M1 is Ca or Ba, and M2 is one of La, Y, Dy, Er, Yb, Pr, Nd, Sm, Eu and Gd). In Table 1, "*" in front of a sample number indicates a comparative example.

TABLE 1

| | Composition | | | | | |
|---|---|---|---|---|---|---|
| | Principal component | | | | | Subsidiary component |
| Sample No. | M1 | M2 | x | y | z | a | $MnO_2$ (wt %) |
| *Sample 1 | Ca | La | 0.00 | 0.00 | 0.00 | 0.00 | 0.0 |
| Sample 2 | Ca | La | 0.00 | 0.05 | 0.05 | 0.00 | 0.0 |
| Sample 3 | Ca | La | 0.00 | 0.10 | 0.10 | 0.00 | 0.0 |
| Sample 4 | Ca | La | 0.00 | 0.15 | 0.15 | 0.00 | 0.0 |
| Sample 5 | Ca | La | 0.00 | 0.20 | 0.20 | 0.00 | 0.0 |
| *Sample 6 | Ca | La | 0.00 | 0.30 | 0.30 | 0.00 | 0.0 |
| Sample 7 | Ca | La | 0.00 | 0.05 | 0.05 | 0.00 | 0.4 |
| Sample 8 | Ca | La | 0.00 | 0.10 | 0.10 | 0.00 | 0.4 |
| Sample 9 | Ca | La | 0.00 | 0.15 | 0.15 | 0.00 | 0.4 |
| Sample 10 | Ca | La | 0.00 | 0.20 | 0.20 | 0.00 | 0.4 |
| Sample 11 | Ca | La | 0.40 | 0.10 | 0.10 | 0.00 | 0.4 |
| Sample 12 | Ca | La | 0.80 | 0.10 | 0.10 | 0.00 | 0.4 |
| *Sample 13 | Ca | La | 0.90 | 0.10 | 0.10 | 0.00 | 0.4 |
| Sample 14 | Ca | La | 0.40 | 0.10 | 0.00 | 0.00 | 0.4 |
| Sample 15 | Ca | La | 0.80 | 0.10 | 0.00 | 0.00 | 0.4 |
| Sample 16 | Ca | La | 0.40 | 0.10 | 0.05 | 0.00 | 0.4 |
| Sample 17 | Ca | La | 0.80 | 0.10 | 0.05 | 0.00 | 0.4 |
| Sample 18 | Ca | La | 0.40 | 0.05 | 0.05 | 0.00 | 0.2 |
| Sample 19 | Ca | La | 0.40 | 0.05 | 0.05 | 0.00 | 0.4 |
| Sample 20 | Ca | La | 0.40 | 0.05 | 0.05 | 0.00 | 0.8 |
| Sample 21 | Ca | La | 0.40 | 0.05 | 0.05 | 0.00 | 1.2 |

*indicates a comparative example.

TABLE 2

| | Composition | | | | | |
|---|---|---|---|---|---|---|
| | Principal component | | | | | Subsidiary component |
| Sample No. | M1 | M2 | x | y | z | a | $MnO_2$ (wt %) |
| Sample 22 | Ca | La | 0.35 | 0.10 | 0.05 | 0.20 | 0.4 |
| Sample 23 | Ca | La | 0.35 | 0.10 | 0.05 | 0.40 | 0.4 |
| Sample 24 | Ca | La | 0.35 | 0.10 | 0.05 | 0.60 | 0.4 |
| Sample 25 | Ca | La | 0.35 | 0.10 | 0.05 | 0.80 | 0.4 |
| Sample 26 | Ca | La | 0.35 | 0.10 | 0.05 | 1.00 | 0.4 |
| Sample 27 | Ca | Y  | 0.40 | 0.10 | 0.05 | 0.00 | 0.4 |
| Sample 28 | Ca | Dy | 0.40 | 0.10 | 0.05 | 0.00 | 0.4 |
| Sample 29 | Ca | Er | 0.40 | 0.10 | 0.05 | 0.00 | 0.4 |
| Sample 30 | Ca | Yb | 0.40 | 0.10 | 0.05 | 0.00 | 0.4 |
| Sample 31 | Ba | La | 0.20 | 0.10 | 0.05 | 0.00 | 0.4 |
| Sample 32 | Ba | Y  | 0.20 | 0.10 | 0.05 | 0.00 | 0.4 |
| Sample 33 | Ba | Dy | 0.20 | 0.10 | 0.05 | 0.00 | 0.4 |
| Sample 34 | Ba | Er | 0.20 | 0.10 | 0.05 | 0.00 | 0.4 |
| Sample 35 | Ba | Yb | 0.20 | 0.10 | 0.05 | 0.00 | 0.4 |
| Sample 36 | Ca | Pr | 0.20 | 0.10 | 0.05 | 0.20 | 0.4 |
| Sample 37 | Ca | Nd | 0.20 | 0.10 | 0.05 | 0.20 | 0.4 |

TABLE 2-continued

| | Composition | | | | | | |
|---|---|---|---|---|---|---|---|
| | Principal component | | | | | | Subsidiary component |
| Sample No. | M1 | M2 | x | y | z | a | MnO$_2$ (wt %) |
| Sample 38 | Ca | Sm | 0.20 | 0.10 | 0.05 | 0.20 | 0.4 |
| Sample 39 | Ca | Eu | 0.20 | 0.10 | 0.05 | 0.20 | 0.4 |
| Sample 40 | Ca | Gd | 0.20 | 0.10 | 0.05 | 0.20 | 0.4 |
| Sample 41 | Ba | Nd | 0.20 | 0.10 | 0.05 | 0.00 | 0.4 |

With respect to these discs formed of piezoelectric ceramics, measurements were conducted on the capacitance C at 1 kHz, the thickness t of the disc, the diameter D of the disc, the resonance frequency $F_r$ of vibration in a thickness direction of the disc, the antiresonance frequency $F_a$ of vibration in the thickness direction of the disc, the resonance frequency $f_r$ of vibration in a radial direction of the disc, the resistance R at a resonant point of vibration in the radial direction of the disc, the antiresonance frequency $f_a$ of vibration of the radial direction of the disc and the Poisson's ratio $\sigma^E$. Then, from these values, the relative dielectric constant $\epsilon_r$, the electromechanical coupling factor $k_p$ of a radial expand mode, the electromechanical coupling factor $k_t$ of a thickness extensional (TE) vibration mode, the mechanical quality factor $Q_M$ and the frequency constant $N_p$ of the radial expand mode were calculated by a resonance-antiresonance method according to IEEE Standard on piezoelectricity (ANSI/IEEE Std. 176-1987). The results of the measurements are shown in Table 3 and Table 4.

TABLE 3

| | Piezoelectric properties | | | | |
|---|---|---|---|---|---|
| Sample No. | $k_t$ (%) | $k_p$ (%) | $Q_M$ | $N_p$ (Hz · m) | $\epsilon_r$ |
| *Sample 1 | 9.8 | 3.6 | 440 | 2720 | 147 |
| Sample 2 | 10.8 | 3.8 | 490 | 2740 | 149 |
| Sample 3 | 11.2 | 4.2 | 460 | 2770 | 151 |
| Sample 4 | 10.4 | 4.0 | 480 | 2760 | 152 |
| Sample 5 | 10.2 | 4.0 | 460 | 2770 | 153 |
| *Sample 6 | 9.3 | 3.6 | 440 | 2740 | 153 |
| Sample 7 | 13.8 | 4.4 | 3820 | 2780 | 142 |
| Sample 8 | 14.3 | 4.3 | 3740 | 2790 | 146 |
| Sample 9 | 13.1 | 4.2 | 3280 | 2790 | 147 |
| Sample 10 | 12.8 | 4.1 | 2870 | 2780 | 149 |
| Sample 11 | 17.3 | 6.5 | 5500 | 2800 | 118 |
| Sample 12 | 19.1 | 6.7 | 3540 | 2790 | 135 |
| *Sample 13 | 17.8 | 2.7 | 3620 | 2850 | 110 |
| Sample 14 | 18.5 | 7.2 | 4890 | 2810 | 117 |
| Sample 15 | 18.2 | 6.6 | 3710 | 2780 | 132 |
| Sample 16 | 21.3 | 7.6 | 5870 | 2820 | 117 |
| Sample 17 | 18.1 | 6.9 | 3790 | 2780 | 134 |
| Sample 18 | 19.8 | 7.7 | 5430 | 2790 | 122 |
| Sample 19 | 22.1 | 8.2 | 7820 | 2810 | 119 |
| Sample 20 | 19.4 | 7.5 | 4370 | 2800 | 118 |
| Sample 21 | 17.4 | 7.1 | 3690 | 2810 | 120 |

*indicates a comparative example.

TABLE 4

| | Piezoelectric properties | | | | |
|---|---|---|---|---|---|
| Sample No. | $k_t$ (%) | $k_p$ (%) | $Q_M$ | $N_p$ (Hz · m) | $\epsilon_r$ |
| Sample 22 | 21.2 | 7.4 | 5460 | 2790 | 126 |
| Sample 23 | 22.7 | 8.0 | 5230 | 2780 | 124 |
| Sample 24 | 20.5 | 7.2 | 5190 | 2760 | 121 |
| Sample 25 | 19.2 | 6.9 | 4340 | 2750 | 119 |
| Sample 26 | 17.5 | 6.3 | 3810 | 2740 | 115 |
| Sample 27 | 22.1 | 7.9 | 5170 | 2810 | 121 |
| Sample 28 | 22.4 | 7.9 | 5320 | 2790 | 125 |
| Sample 29 | 22.1 | 7.7 | 5290 | 2780 | 123 |
| Sample 30 | 21.9 | 7.5 | 5310 | 2790 | 122 |
| Sample 31 | 13.5 | 6.7 | 3850 | 2690 | 223 |
| Sample 32 | 13.2 | 6.8 | 3760 | 2660 | 214 |
| Sample 33 | 13.5 | 6.4 | 3460 | 2670 | 227 |
| Sample 34 | 13.4 | 6.7 | 3560 | 2630 | 223 |
| Sample 35 | 12.9 | 6.5 | 3550 | 2640 | 229 |
| Sample 36 | 22.5 | 6.9 | 5460 | 2710 | 144 |
| Sample 37 | 23.4 | 7.1 | 5740 | 2680 | 148 |
| Sample 38 | 21.6 | 6.7 | 5380 | 2670 | 146 |
| Sample 39 | 20.8 | 6.6 | 5460 | 2630 | 146 |
| Sample 40 | 20.9 | 6.6 | 5540 | 2640 | 145 |
| Sample 41 | 14.2 | 7.0 | 3770 | 2660 | 224 |

What is particularly important when the piezoelectric ceramic is used as a piezoelectric body of a piezoelectric element utilizing a third harmonic thickness extensional (TE) vibration mode is the electromechanical coupling factor $k_t$ of the thickness extensional (TE) vibration mode. As becomes clear from Table 3 and Table 4, the electromechanical coupling factor $k_t$ of every ceramic composition according to the present example was larger than that of Sample 1, which was a known ceramic composition, serving as a comparative example. Based on the ratios shown in Table 1 and Table 2, a part of Sr was replaced by Ca or La, and a part of Nb was replaced by Ta or Ti, thereby achieving a larger electromechanical coupling factor $k_t$. Also, MnO$_2$ as the subsidiary component was added to the above-mentioned principal components, thereby achieving a larger mechanical quality factor $Q_M$.

In particular, by using a piezoelectric ceramic composition satisfying $0.0 \leq a \leq 0.6$, $0.2 \leq x \leq 0.8$, $0.0 < y < 0.15$ and $0.0 < z < 0.15$, it became possible to increase the electromechanical coupling factor $k_t$ and the mechanical quality factor $Q_M$.

EXAMPLE 2

In the present example, an example of producing the piezoelectric resonator 10 shown in FIG. 1 by using the ceramic composition of Example 1 will be described.

In the piezoelectric resonator of the present example, the piezoelectric body 11 was produced using the piezoelectric ceramic composition of Sample 16 of Example 1. The piezoelectric body 11 was formed by dicing and abrading the sample after polarization. The electrodes 12a and 12b were circular electrodes made of silver. The electrodes 12a and 12b were formed to have a thickness of 0.8 µm by vapor deposition.

Figure 3:
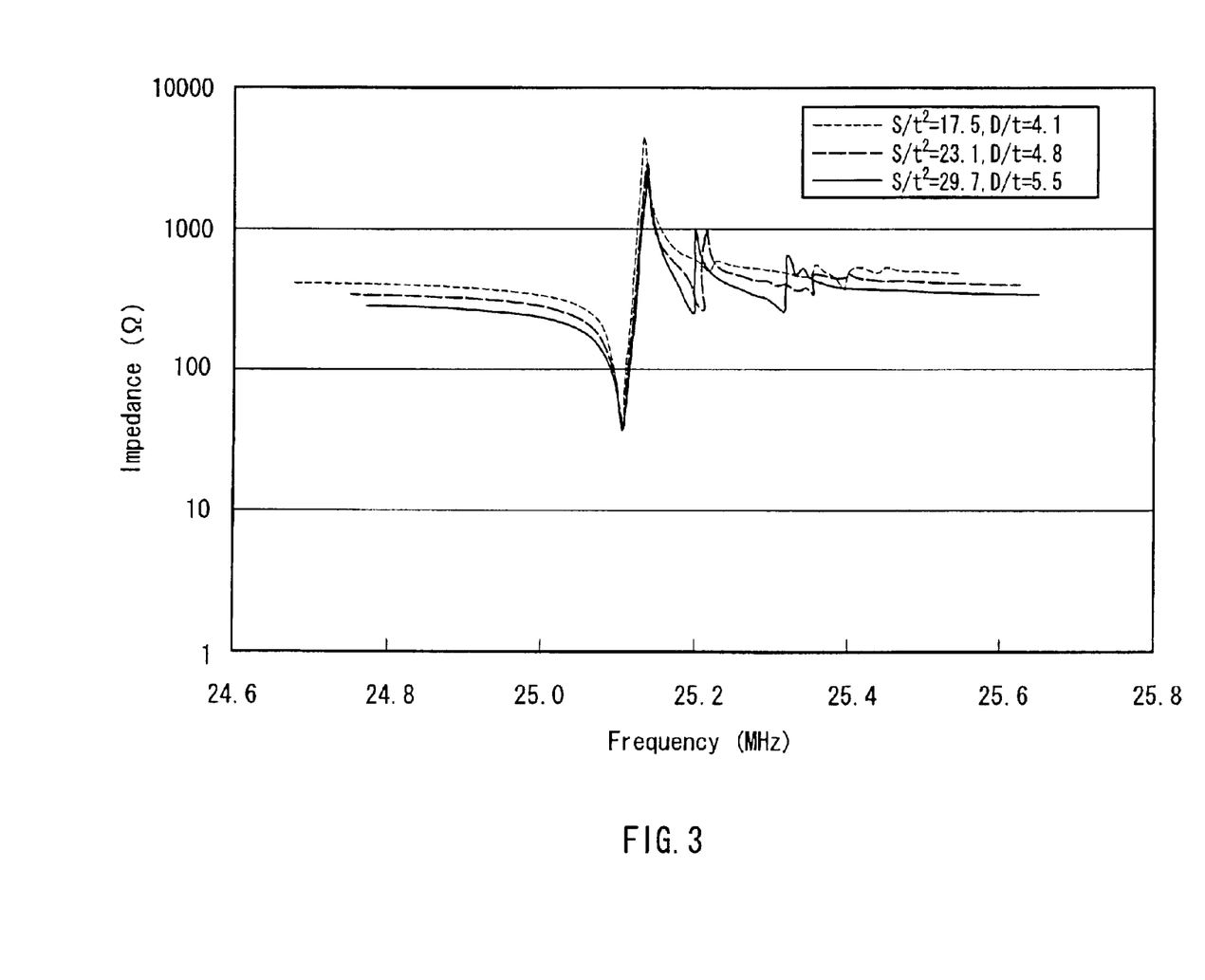
FIG. 3 illustrates an example of the impedance characteristics of a piezoelectric resonator in Example 2 of the present invention.
Figure 4:
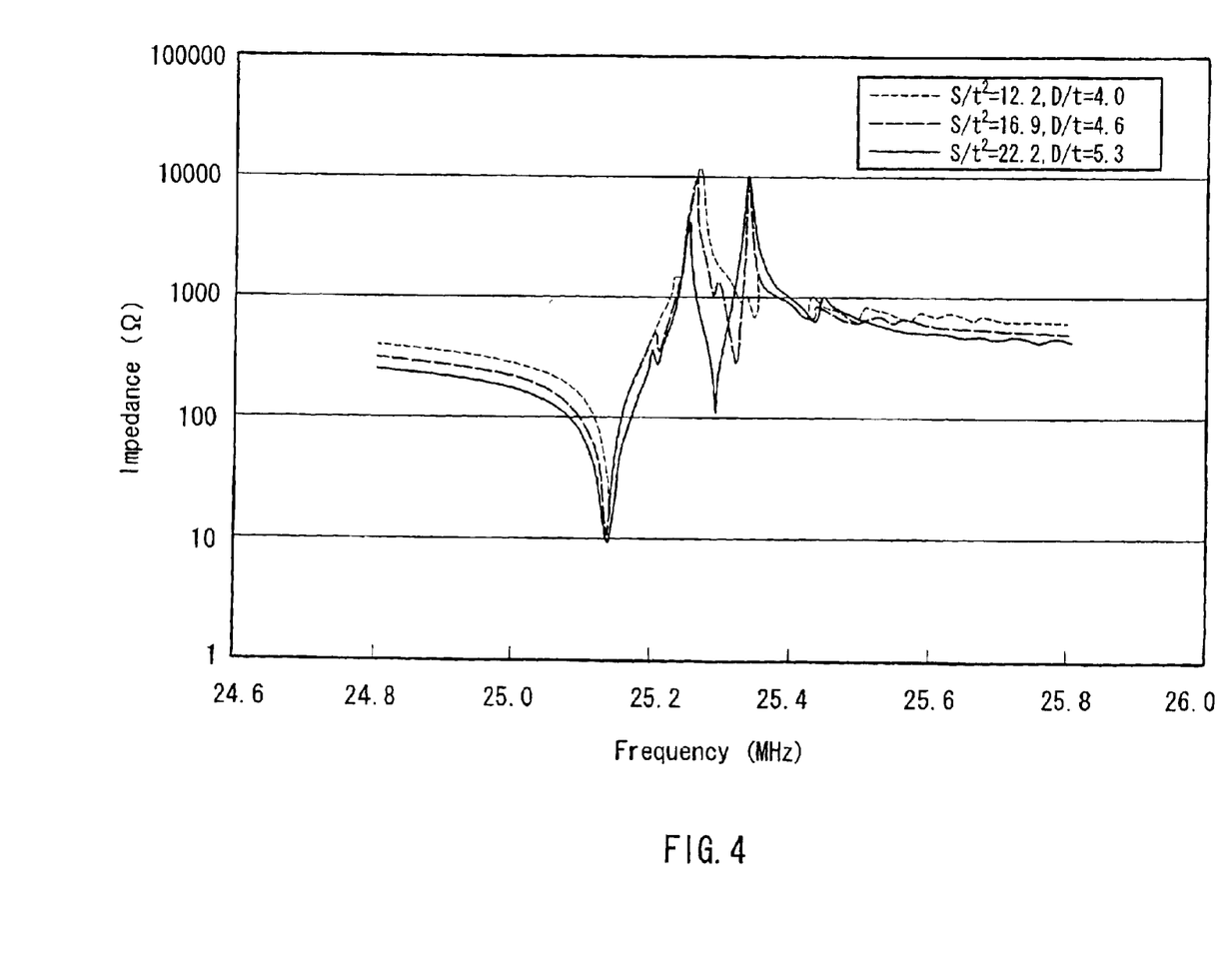
FIG. 4 illustrates an example of the impedance characteristics of a conventional piezoelectric resonator.

In the present example, a 5.1 mm×5.1 mm piezoelectric body having a thickness t of 0.29 mm was used. Three kinds of piezoelectric resonators were produced by changing the diameter D of the Ag electrode from about 1.2 mm to about 1.6 mm. FIG. 3 shows the impedance characteristics of these three kinds of the piezoelectric resonators. Similarly, FIG. 4 shows the impedance characteristics of piezoelectric resonators using conventional lead piezoelectric ceramics (Pb$_{0.9}$La$_{0.08}$TiO$_3$) as the piezoelectric bodies. FIGS. 3 and 4 also show the relationship between the electrode area S and the thickness t of the piezoelectric body for each case.

As becomes clear from FIG. 3, unnecessary vibrations and sub-resonance did not appear between the resonance frequency and the antiresonance frequency in any piezoelectric resonators of the present example, which had a resonance frequency of about 25 MHz.

In contrast, as becomes clear from FIG. 4, in the piezoelectric resonators using the conventional piezoelectric ceramic compositions containing lead, the amplitude of sub-resonance becomes larger near the antiresonance frequency (25.3 MHz) when $22 \leq S/t^2$ and $5.3 \leq D/t$, so that the impedance waveforms were split considerably near the antiresonance frequency. As described above, when using the conventional piezoelectric ceramic composition, it was impossible to achieve a practical piezoelectric resonator in the case where $22 \leq S/t^2$ and $5.3 \leq D/t$.

As described above, the piezoelectric resonator using the piezoelectric ceramic composition of Example 1 has less design restrictions on the electrode diameter D, the electrode area S and the thickness t of the piezoelectric body. Furthermore, in the case where $22 \leq S/t^2$ and $5.3 \leq D/t$, the size of the electrodes on the two principal planes is made larger with respect to the thickness t. Therefore, an influence of the decentered electrodes is reduced, which is found to be advantageous in manufacturing.

EXAMPLE 3

In the present example, an example of producing the thickness shear mode piezoelectric resonator 20 shown in FIG. 2 by using the ceramic compositions of Example 1 will be described.

In the piezoelectric resonator of the present example, the piezoelectric body 21 was produced using the piezoelectric ceramic compositions of each of Samples 7 to 10 of Example 1. The piezoelectric body 21 was formed by dicing and abrading the sample that has been polarized in a direction parallel to the principal plane. The electrodes 22a and 22b were strip-shaped electrodes made of silver. The electrodes 22a and 22b were formed to have a thickness of 0.8 μm by vapor deposition.

In the present example, a piezoelectric body having a length L of 5.1 mm, a width W of 1.0 mm and a thickness t of 0.20 mm was used. The dimension A of the overlapping portion of the electrodes was 1.2 mm. Table 5 shows the relationship between the ceramic composition and the temperature characteristics (the rate of change according to temperature) of a resonance frequency of these piezoelectric resonators.

As described above, the piezoelectric resonators using the piezoelectric ceramic compositions of Example 1 have an excellent rate of change in the resonance frequency according to temperature and are suitable as a piezoelectric ceramic composition used for a piezoelectric ceramic oscillator and a piezoelectric ceramic filter.

As mentioned above, according to the piezoelectric ceramic composition of the present invention, it is possible to achieve a piezoelectric ceramic composition that has a larger electromechanical coupling factor than the conventional bismuth layered compound and is free of lead. Furthermore, according to the piezoelectric element of the present invention, it is possible to achieve a piezoelectric element that is free of lead and has excellent electric characteristics.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A piezoelectric ceramic composition comprising:
a ceramic composition expressed by a general formula:

$$Sr_{1-x-y}M1_xM2_yBi_2(Nb_{1-a}Ta_a)_{2-z}Ti_zO_9,$$

wherein M1 is at least one element selected from the group consisting of Ca and Ba, M2 is at least one element selected from the group consisting of La, Y, Dy, Er, Yb, Pr, Nd, Sm, Eu and Gd, and x, y, z and a in the general formula respectively are in the range of
$0.0 \leq x < 0.9$,
$0.0 < y < 0.3$,
$0.0 < z < 0.3$, and
$0.0 \leq a \leq 1.0$.

2. The piezoelectric ceramic composition according to claim 1, further comprising not greater than 0.8 wt % $MnO_2$.

3. The piezoelectric ceramic composition according to claim 1, wherein x, y, z and a in the general formula respectively are in the range of
$0.2 \leq x \leq 0.8$,
$0.0 < y < 0.15$,

TABLE 5

| | Composition | | | | | | Temperature |
| | Principal component | | | | | Subsidiary component | characteristics of resonance frequency |
| Sample No. | M1 | M2 | x | y | z | a | $MnO_2$ (wt %) | (ppm/° C.) |
|---|---|---|---|---|---|---|---|---|
| *Sample 1 | Ca | La | 0.00 | 0.00 | 0.00 | 0.00 | 0.0 | 80 |
| Sample 7 | Ca | La | 0.00 | 0.05 | 0.05 | 0.00 | 0.4 | 58 |
| Sample 8 | Ca | La | 0.00 | 0.10 | 0.10 | 0.00 | 0.4 | 55 |
| Sample 9 | Ca | La | 0.00 | 0.15 | 0.15 | 0.00 | 0.4 | 52 |
| Sample 10 | Ca | La | 0.00 | 0.20 | 0.20 | 0.00 | 0.4 | 49 |

*indicates a comparative example.

As becomes clear from Table 5, the rates of change in the resonance frequency according to temperature of Samples 7 to 10 using the ceramic compositions of Example 1 are all 49 to 58 ppm/° C. and smaller than that of Sample 1 serving as the comparative example, which is 80 ppm/° C.

$0.0 < z < 0.15$, and
$0.0 \leq a \leq 0.6$.

4. The piezoelectric ceramic composition according to claim 3, further comprising not greater than 0.8 wt % $MnO_2$.

5. A piezoelectric element comprising:

a piezoelectric body formed of a piezoelectric ceramic composition comprising a ceramic composition expressed by a general formula:

$$Sr_{1-x-y}M1_xM2_yBi_2(Nb_{1-a}Ta_a)_{2-z}Ti_zO_9,$$

wherein M1 is at least one element selected from the group consisting of Ca and Ba, M2 is at least one element selected from the group consisting of La, Y, Dy, Er, Yb, Pr, Nd, Sm, Eu and Gd, and x, y, z and a in the general formula respectively are in the range of $0.0 \leq x < 0.9$,
$0.0 < y < 0.3$,
$0.0 < z < 0.3$, and
$0.0 \leq a \leq 1.0$.

6. The piezoelectric element according to claim 5, further comprising not greater than 0.8 wt % $MnO_2$.

7. The piezoelectric element according to claim 5, satisfying $22 \leq S/t^2$, wherein S is an area of an electrode formed on a surface of the piezoelectric body, and t is a thickness of the piezoelectric body.

8. The piezoelectric element according to claim 5, satisfying $5.3 \leq D/t$, wherein D is an effective diameter of an electrode when the piezoelectric body is approximated effectively to a circular shape, and t is a thickness of the piezoelectric body.

9. The piezoelectric element according to claim 5, wherein x, y, z and a in the general formula respectively are in the range of $0.2 \leq x \leq 0.8$,
$0.0 < y < 0.15$,
$0.0 < z < 0.15$, and
$0.0 \leq a \leq 0.6$.

10. The piezoelectric element according to claim 9, further comprising not greater than 0.8 wt % $MnO_2$.

11. The piezoelectric element according to claim 9, satisfying $22 \leq S/t^2$, wherein S is an area of an electrode formed on a surface of the piezoelectric body, and t is a thickness of the piezoelectric body.

12. The piezoelectric element according to claim 9, satisfying $5.3 \leq D/t$, wherein D is an effective diameter of an electrode when the piezoelectric body is approximated effectively to a circular shape, and t is a thickness of the piezoelectric body.

* * * * *